United States Patent
Yang et al.

(10) Patent No.: US 10,283,631 B2
(45) Date of Patent: May 7, 2019

(54) SEMICONDUCTOR DEVICE AND METHOD OF FABRICATING THE SAME

(71) Applicants: DELTA ELECTRONICS, INC., Taoyuan (TW); National Central University, Taoyuan (TW)

(72) Inventors: Chun-Chieh Yang, Taoyuan (TW); Jen-Inn Chyi, Taoyuan (TW); Geng-Yen Lee, Taoyuan (TW)

(73) Assignees: DELTA ELECTRONICS, INC., Taoyuan (TW); NATIONAL CENTRAL UNIVERSITY, Taoyuan (TW)

( * ) Notice: Subject to any disclaimer, the term of this patent is extended or adjusted under 35 U.S.C. 154(b) by 0 days.

(21) Appl. No.: 15/152,576

(22) Filed: May 12, 2016

(65) Prior Publication Data

US 2016/0336436 A1 Nov. 17, 2016

Related U.S. Application Data

(60) Provisional application No. 62/160,142, filed on May 12, 2015.

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/0843* (2013.01); *H01L 29/2003* (2013.01);
(Continued)

(58) Field of Classification Search
CPC .............. H01L 29/7784; H01L 29/2003; H01L 29/205; H01L 29/404; H01L 29/66462; H01L 29/7783; H01L 29/7786
(Continued)

(56) References Cited

U.S. PATENT DOCUMENTS 6,639,255 B2 10/2003 Inoue
6,849,882 B2 2/2005 Chavarkar et al.
(Continued)

FOREIGN PATENT DOCUMENTS

| TW | I310611 B | 6/2009 |
|----|-----------|--------|
| TW | I315100 B | 9/2009 |
| WO | 2010/126288 A1 | 11/2010 |

OTHER PUBLICATIONS

Ján Kuzmik, Power Electronics on InAlN/(In)GaN:Prospect for a Record Performance, IEEE Electron Device Letters, p. 510-512,vol. 22, No. 11, Nov. 2001.
(Continued)

*Primary Examiner* — Mouloucoulaye Inoussa
(74) *Attorney, Agent, or Firm* — CKC & Partners Co., LLC

(57) ABSTRACT

In one aspect of the present disclosure, a semiconductor device includes a channel layer, an $Al_xIn_{1-x}N$ layer on the channel layer with a thickness of t1, and a reverse polarization layer on the $Al_xIn_{1-x}N$ layer with a thickness of t2. The thickness is $0.5 \times t1 \leq t2 \leq 3 \times t1$. In another aspect of the present disclosure, a method of manufacturing a semiconductor device is provided. The method including: forming a channel layer on a substrate; forming an $Al_xIn_{1-x}N$ layer on the channel layer with a thickness of t1; and forming a reverse polarization layer on the $Al_xIn_{1-x}N$ layer with a thickness of t2. The thickness is $0.5 \times t1 \leq t2 \leq 3 \times t1$.

21 Claims, 5 Drawing Sheets

(51) Int. Cl.
  *H01L 29/66* (2006.01)
  *H01L 29/205* (2006.01)
  *H01L 29/40* (2006.01)
  *H01L 29/423* (2006.01)
  *H01L 29/43* (2006.01)
  *H01L 29/08* (2006.01)

(52) U.S. Cl.
  CPC .......... *H01L 29/205* (2013.01); *H01L 29/402* (2013.01); *H01L 29/4236* (2013.01); *H01L 29/42316* (2013.01); *H01L 29/42376* (2013.01); *H01L 29/432* (2013.01); *H01L 29/66462* (2013.01)

(58) Field of Classification Search
  USPC .......... 257/76, 194, 192; 438/172, 285, 590
  See application file for complete search history.

(56) References Cited

U.S. PATENT DOCUMENTS

| | | | |
|---|---|---|---|
| 7,238,560 | B2 | 7/2007 | Sheppard et al. |
| 2002/0066908 | A1 | 6/2002 | Smith |
| 2004/0061129 | A1* | 4/2004 | Saxler ............... H01L 29/66462 257/192 |
| 2005/0110043 | A1* | 5/2005 | Otsuka .............. H01L 29/66462 257/194 |
| 2006/0006435 | A1 | 1/2006 | Saxler et al. |
| 2010/0038682 | A1* | 2/2010 | Lahreche .......... H01L 21/28575 257/194 |
| 2010/0270591 | A1* | 10/2010 | Ahn .................... H01L 29/7782 257/194 |
| 2012/0315742 | A1 | 12/2012 | Yui et al. |
| 2013/0334538 | A1* | 12/2013 | Saunier ................ H01L 29/778 257/76 |
| 2014/0361308 | A1 | 12/2014 | Yui et al. |

OTHER PUBLICATIONS

Dong Seup Lee et al., 300-GHz InAlN/GaN HEMTs With InGaN Back Barrier, IEEE Electron Device Letters, p. 1525-1527, vol. 32, No. 11, Nov. 2011.

F. Medjdoub et at., Can InAlN/GaN be an alternative to high power / high temperature AlGaN/GaN devices? International Electron Devices Meeting, 2006, p. 1-4, IEEE.

H. C. Chiu et al., N2O treatment enhancement-mode InAlN/GaN HEMTs with HfZrO2 High-k insulator, Microelectronics Reliability, 55, 2015,p. 48-51.

Zhongda Li et al., A New Method to Modify Two-Dimensional Electron Gas Density by GaN Cap Etching , Japanese Journal of Applied Physics ,2013, 52, p. 08JN11-1-08JN11-3.

Jungwoo Joh et al., Critical Voltage for Electrical Degradation of GaN High-Electron Mobility Transistors, IEEE Electron Device Letters, Apr. 2008,p. 287-289,vol. 29, No. 4.

J. Kuzmik et al., Analysis of degradation mechanisms in lattice-matched InAlN/GaN highelectron-mobility transistors, J. Appl. Phys. , 2009, 106, p. 124503-1-124503-7.

T. Kehagias et al., Indium migration paths in V-defects of InAlN grown by metal-organic vapor phase epitaxy, Applied Physics Letters 95, 2009, p. 071905-1-071905-3.

M. Gonschorek et al., High electron mobility lattice-matched Al InN/GaN field-effect transistor heterostructures, Applied Physics Letters 89, 2006, p. 062106-1-062106-3.

S. Turuvekere, et al., Gate Leakage Mechanisms in AlGaN GaN and AlInN GaN HEMTs Comparison and Modeling, IEEE Transactions on Electron Devices, Oct. 2013, p. 3157-3165,vol. 60, No. 10.

Satyaki Ganguly,et al.,Polarization effects on gate leakage in InAlN/AlN/GaN high-electron mobility transistors, Applied Physics Letters 101, (2012), 253519-1-253519-5.

M. Tapajna et al., Hot-Electron-Related Degradation in InAlN GaN,IEEE Transactions on Electron Devices, Aug. 2014, p. 2793-2801,vol. 61, No. 8.

Q. Fareed et al., High voltage operation of field-plated AlInN HEMTs, Phys. Status Solidi C 8, No. 7-8, (2011) /DOI10.1002/pssc.201001103, p. 2454-2456.

Q. Zhou et al., Schottky Source/Drain InAlN/AlN/GaN MISHEMT With Enhanced Breakdown Voltage,IEEE Electron Device Letters, Jan. 2012 p. 38-40,vol. 33,No. 1.

H.-S. Lee et al., 3000-V 4.3-mΩ—cm2 InAlN/GaN MOSHEMTs With AlGaN Back Barrier, IEEE Electron Device Letters, Jul. 2012, p. 982-984,vol. 33, No. 7.

G. Meneghesso et al., Current Collapse and High-Electric-Field Reliability of Unpassivated GaN/AlGaN/GaN HEMTs, IEEE Transactions on Electron Devices, Dec. 2006, p. 2932-2940,vol. 53, No. 12.

M. Kanamura et al., Enhancement-Mode GaN MIS-HEMTs With n-GaN i-AlN n-GaN Triple Cap Layer and High-k Gate Dielectrics, IEEE Electron Device Letters, Mar. 2010, p. 189-191,vol. 31, No. 3.

M. Jurkovic et al., Schottky-Barrier Normally Off GaN/InAlN/AlN/GaN HEMT With Selectively Etched Access Region, IEEE Electron Device Letters, Mar. 2013, p. 432-434,vol. 34, No. 3.

L. Shen,et al., High-Power Polarization-Engineered GaN AlGaN GaN HEMTs Without Surface Passivation, IEEE Electron Device Letters, vol. 25, No. 1, Jan. 2004, p. 7-9.

\* cited by examiner

SEMICONDUCTOR DEVICE AND METHOD OF FABRICATING THE SAME

RELATED APPLICATIONS

This application claims the priority benefit of U.S. Provisional Application Ser. No. 62/160,142, filed May 12, 2015, which is herein incorporated by reference.

BACKGROUND

Technical Field

The present disclosure relates to a semiconductor device and a method of manufacturing the same, and more particularly to a semiconductor device having a nitride-based high electron mobility transistors (HEMTs) and its manufacturing method.

Description of Related Art

HEMT is a device used in high power and/or high frequency operation. These devices use the spontaneous polarization and the piezo polarization to induce two dimensional electron gas (2DEG) in the heterojunction of two semiconductor material which have different bandgap energies.

AlGaN and GaN are usually applied in typical HEMT devices. The 2DEG increases with the increase in Al composition of the AlGaN. However, since AlGaN material shows a large lattice mismatching against GaN, the increase of Al composition may cause crack to occur at the interface. Another type HEMT device use AlInN instead of AlGaN, since AlInN has many advantages compared to AlGaN. For example, AlInN is in the lattice constant thereof matches with GaN, and thus crack or the like that will degrade the performance of the HEMT device will not occur; AlInN has higher spontaneous polarization and higher conduction band energy discontinuity, thus 2DEG will increase at the interface.

However the electron mobility and breakdown voltage of AlInN-based HEMT devices are still inferior to the AlGaN-based HEMT devices. Owing to the large difference in dissociation temperature between AlN and InN, it is difficult in preparing a high-quality AlInN layer. The resultant alloy scattering and interface roughness scattering will deteriorate electron mobility. Besides, the strong polarization field in the AlInN layer could enhance tunneling current and lead to high gate leakage current and low breakdown voltage. Therefore, a solution is urgently needed to improve the AlInN-based HEMT device.

SUMMARY

In one aspect of the present disclosure, a semiconductor device includes a channel layer, an $Al_xIn_{1-x}N$ layer on the channel layer with a thickness of t1, and a reverse polarization layer on the $Al_xIn_{1-x}N$ layer with a thickness of t2. The thickness is $0.5 \times t1 \leq t2 \leq 3 \times t1$.

In another aspect of the present disclosure, a method of manufacturing a semiconductor device is provided. The method including: forming a channel layer on a substrate; forming an $Al_xIn_{1-x}N$ layer on the channel layer with a thickness of t1; and forming a reverse polarization layer on the $Al_xIn_{1-x}N$ layer with a thickness of t2. The thickness is $0.5 \times t1 \leq t2 \leq 3 \times t1$.

BRIEF DESCRIPTION OF THE DRAWINGS

The disclosure can be more fully understood by reading the following detailed description of the embodiment, with reference made to the accompanying drawings as follows.

DETAILED DESCRIPTION

The present disclosure now will be described more fully hereinafter with reference to the accompanying drawings, in which preferred embodiments of the disclosure are shown. This disclosure may be embodied in many different forms and should not be construed as limited to the embodiments set forth herein; rather, these embodiments are provided so that this disclosure will be thorough and complete, and will fully convey the scope of the disclosure to those skilled in the art. Accordingly, the present disclosure is not limited to the relative size, spacing and alignment illustrated in the accompanying figures, As will also be appreciated by those of skill in the art, references herein to a layer formed "on" a substrate or other layer may refer to the layer formed directly on the substrate or other layer or on an intervening layer of layers formed on the substrate or other layer.

Figure 1:
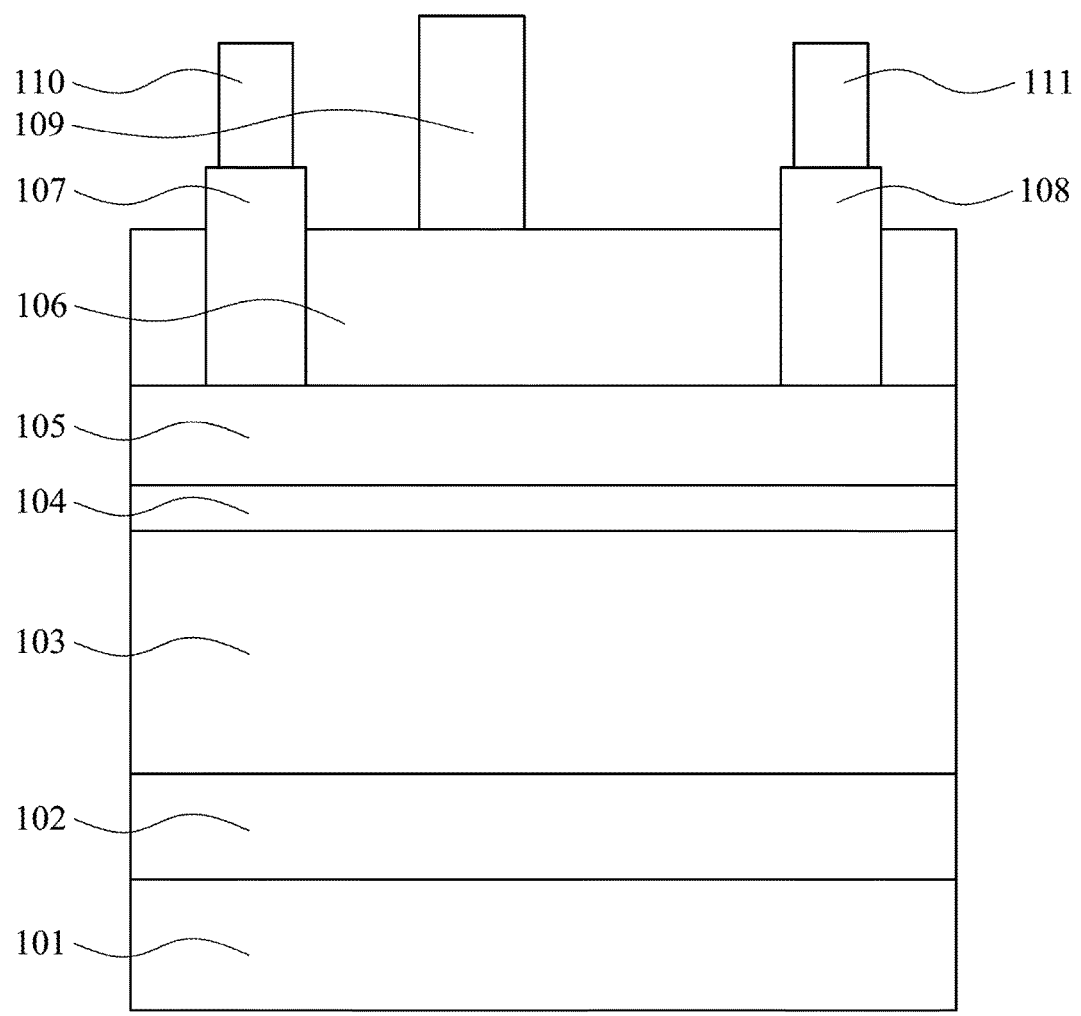
FIGS. 1-4 illustrate cross-sectional views of semiconductor devices in accordance with some embodiments of the present disclosure.

FIG. 1 shows a semiconductor device in accordance with an embodiment of the present disclosure. The semiconductor device 100 includes a substrate 101, a buffer layer 102, a channel layer 103, a spacer layer 104, an $Al_xIn_{1-x}N$ layer 105 and a reverse polarization layer 106. In some embodiments, the substrate 101 can be made of a variety of materials such as Ge, SiGe, SiC, Si, sapphire, or a combination thereof.

A buffer layer 102 is disposed on the substrate 101. In some embodiments, the buffer layer 102 can be made of GaN, AlN, AlGaN, or a combination thereof.

A channel layer 103 is disposed on the buffer layer 102. In some embodiments, the channel layer 103 can be made of GaN, InGaN, AlInGaN, AlGaN, or a combination thereof.

In some embodiments, a spacer layer 104 of AlN is optionally disposed on the channel layer 103. The spacer layer 104 can reduce alloy scattering effect and increase 2DEG. In some embodiments, the thickness of spacer layer 104 is in the range from about 0.5 nm to 2.5 nm.

An $Al_xIn_{1-x}N$ layer 105, where $0<x<1$, is disposed on the spacer layer 104.

A reverse polarization layer 106 is disposed on the layer 105. Without the reverse polarization layer 106, the positive charges are formed at the interface between the channel layer 103 and the $Al_xIn_{1-x}N$ layer 105, which will not be balanced by other fixed charges in off-state, and thus can only be balanced by free electrons on the gate, causing high electric field in the gate oxide. As a result, the semiconductor device breakdown at low voltage. By adding the reverse polarization layer 106, it induces the negative charge, which balances the positive charge in off-state and therefore the electric field can be greatly reduced and breakdown voltage is increased [Zhongda Li and T. Paul Chow 2013 *Jpn. J. Appl. Phys.* 52 08JN11].

In some embodiments, the reverse polarization layer 106 can be made of GaN, InGaN, $Al_yIn_{1-y}N$, AlInGaN, or a combination thereof and wherein $x>y$. In other words, when the reverse polarization layer 106 is made of $Al_yIn_{1-y}N$, the Al composition in the reverse polarization layer 106 is lower than the Al composition in the $Al_xIn_{1-x}N$ layer 105. The polarization field of the reverse polarization layer 106 is smaller than that of the $Al_xIn_{1-x}N$ layer 105 and the thickness ratio of the reverse polarization layer 106 and the $Al_xIn_{1-x}N$ layer 105 is between 0.5 and 3. In some embodiments, the thickness ratio of the reverse polarization layer 106 and the $Al_xIn_{1-x}N$ layer 105 is between 1 and 2. In some embodiments, the thickness ratio of the reverse polarization layer 106 and the $Al_xIn_{1-x}N$ layer 105 is between 1.1 and 1.5.

The semiconductor device 100 further includes a source 107, a drain 108 and a gate 109. A source contact 110 is formed on the source and a drain contact 111 is formed on the drain. In some embodiments, the source 107 and the drain 108 can be formed by doping N-type impurities or P-type impurities in a semiconductor layer, such as Si, Ge or SiGe. In some embodiments, the gate 109, the source contact 110, and the drain contact 111 can be independently made of Ni, Al, Ti, Au, W, TiN, or a combination thereof. It should be noted, 2DEG is formed at the junction between the $Al_xIn_{1-x}N$ layer 105 and the channel layer 103.

Figure 2:
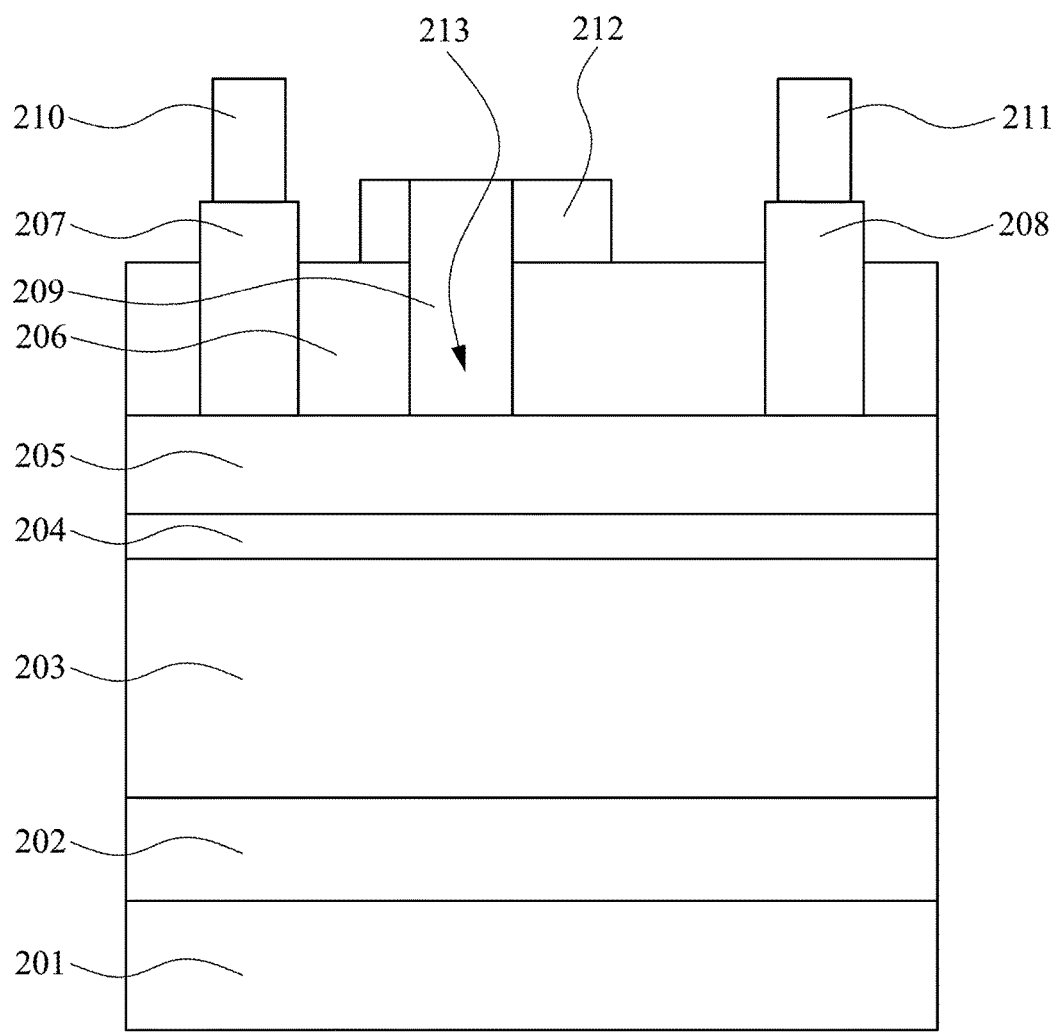

FIG. 2 shows a semiconductor device 200 of an embodiment of the present disclosure. The difference between the semiconductor device 200 and the semiconductor device 100 is that the semiconductor device 200 further includes a recess 213 in the reverse polarization layer 206, in which a gate 209 inserts. In some embodiments, the substrate 201 can be made of a variety of materials such as Ge, SiGe, SiC, Si, sapphire or a combination thereof. A buffer layer 202 is disposed on the substrate 201. In some embodiments, the buffer layer 202 can be made of GaN, AlN, AlGaN, or a combination thereof. A channel layer 203 is disposed on the buffer layer 202. In some embodiments, the channel layer 203 can be made of GaN, InGaN, AlInGaN, AlGaN, or a combination thereof. In some embodiments, a spacer layer 204 of AlN is optionally disposed on the channel layer 203. The spacer layer 204 can reduce alloy scattering effect and increase 2DEG. In some embodiments, the thickness of spacer layer 204 is in the range from about 0.5 nm to 2.5 nm. An $Al_xIn_{1-x}N$ layer 205, where $0<x<1$ is disposed on the spacer layer 204. A reverse polarization layer 206 is disposed on the $Al_xIn_{1-x}N$ layer 205. In some embodiments, the reverse polarization layer 206 can be made of GaN, InGaN, $Al_yIn_{1-y}N$, AlInGaN, or a combination thereof and wherein x>y. In other words, when the reverse polarization layer 206 is made of $Al_yIn_{1-y}N$, the Al composition in the reverse polarization layer 206 is lower than the Al composition in the $Al_xIn_{1-x}N$ layer 205. The polarization field of the reverse polarization layer 206 is smaller than that of the $Al_xIn_{1-x}N$ layer 205 and the thickness ratio of the reverse polarization layer 206 and the $Al_xIn_{1-x}N$ layer 205 is between 0.5 and 3. In some embodiments, the thickness ratio of the reverse polarization layer 206 and the $Al_xIn_{1-x}N$ layer 205 is between 1 and 2. In some embodiments, the thickness ratio of the reverse polarization layer 206 and the $Al_xIn_{1-x}N$ layer 205 is between 1.1 and 1.5.

A recess 213 is included in the reverse polarization layer 206. A gate 209 is formed on the $Al_xIn_{1-x}N$ layer 205. A source 207 and a drain 208 are formed at opposite sides of the gate 209 and on the $Al_xIn_{1-x}N$ layer 205. A source contact 210 is formed on the source 207 and a drain contact 211 is form on the drain 208. In some embodiments, the source 207 and the drain 208 can be formed by doping N-type impurities or P-type impurities in a semiconductor layer, such as Si, Ge or SiGe. In some embodiments, the gate 209, the source contact 210 and the drain contact 211 can be independently made of Ni, Al, Ti, Au, W, TiN, or a combination thereof. A gate field plate 212 is formed and connected to a sidewall of the gate 209.

Figure 3:
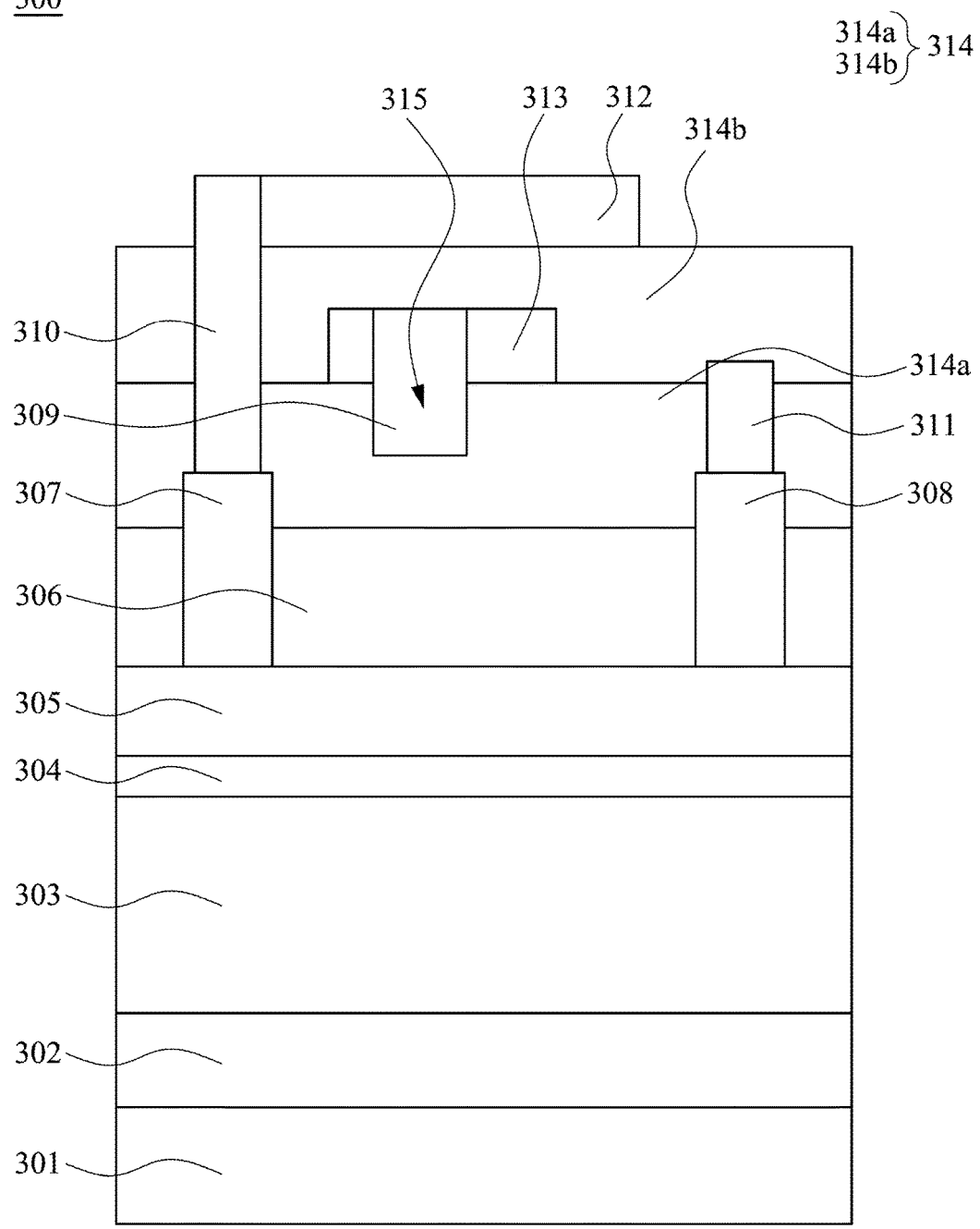

FIG. 3 shows a semiconductor device 300 according to an embodiment of the present disclosure. The difference between the semiconductor 300 and semiconductor device 100 resides in that the semiconductor device 300 further includes a source field plate 312, a gate field plate 313 and an insulating layer 314 encompassing the gate 309 and the gate field plate 313. In some embodiments, the substrate 301 can be made of different materials such as Ge, SiGe, SiC, Si, sapphire, or a combination thereof. A buffer layer 302 is disposed on the substrate 301. In some embodiments, the buffer layer 302 can be made of GaN, AlN, AlGaN, or a combination thereof. A channel layer 303 is disposed on the buffer layer 302. In some embodiments, the channel layer 303 can be made of GaN, InGaN, AlInGaN AlGaN, or a combination thereof. In some embodiments, a spacer layer 304 of AlN is optionally disposed on the channel layer 303. The spacer layer 304 can reduce alloy scattering effect and increase 2DEG. The thickness of spacer layer 304 is in the range from about 0.5 nm to 2.5 nm. An $Al_xIn_{1-x}N$ layer 305, where $0<x<1$, disposed on the spacer layer. A reverse polarization layer 306 disposed on the $Al_xIn_{1-x}N$ layer 305. In some embodiments, the reverse polarization layer 306 can be made of GaN, InGaN, $Al_yIn_{1-y}N$, AlInGaN, or a combination thereof and wherein x>y. In other words, when the reverse polarization layer 306 is made of $Al_yIn_{1-y}N$, the Al composition in the reverse polarization layer 306 is lower than the Al composition in the $Al_xIn_{1-x}N$ layer 305. The polarization field of the reverse polarization layer 306 is smaller than that of the $Al_xIn_{1-x}N$ layer 305 and the thickness ratio of the reverse polarization layer 306 and the $Al_xIn_{1-x}N$ layer 305 is between 0.5 and 3. In some embodiments, the thickness ratio of the reverse polarization layer 306 and the $Al_xIn_{1-x}N$ layer 305 is between 1 and 2. In some embodiments, the thickness ratio of the reverse polarization layer 306 and the $Al_xIn_{1-x}N$ layer 305 is between 1.1 and 1.5.

The semiconductor device 300 further includes a source 307, a drain 308, a gate 309, a source contact 310, a drain contact 311, a source field plate 312, a gate field plate 313 and an insulating layer 314. The insulating layer 314 includes an insulating layer 314a and an insulating layer 314b. The insulating layer 314a is disposed on the reverse polarization layer 306 and includes a recess 315, in which the gate 309 inserts. The gate field plate 313 is formed and connected to a sidewall of the gate 309. The insulating layer 314b is further covering on the gate 309 and the gate field plate 313.

The source 307 and the drain 308 are formed at opposite sides of the gate 309 and on the $Al_xIn_{1-x}N$ layer 305. A source contact 310 is formed on the source 307 and a drain contact 311 is formed on the drain 308. A source field plate 312 is formed on the gate 309 and physically connected to the source contact 310. In some embodiments, the source 307 and the drain 308 can be formed by doping N-type impurities or P-type impurities in a semiconductor layer, such as Si, Ge or SiGe. In some embodiments, the gate 309, the source contact 310, and the drain contact 311 can be independently made of Ni, Al, Ti, Au, W, TiN, or a combination thereof. The insulating layer 314 can be made of $SiO_2$, SiNx, $Al_2O_3$, $HfO_2$, $TiO_2$, or a combination thereof.

Figure 4:
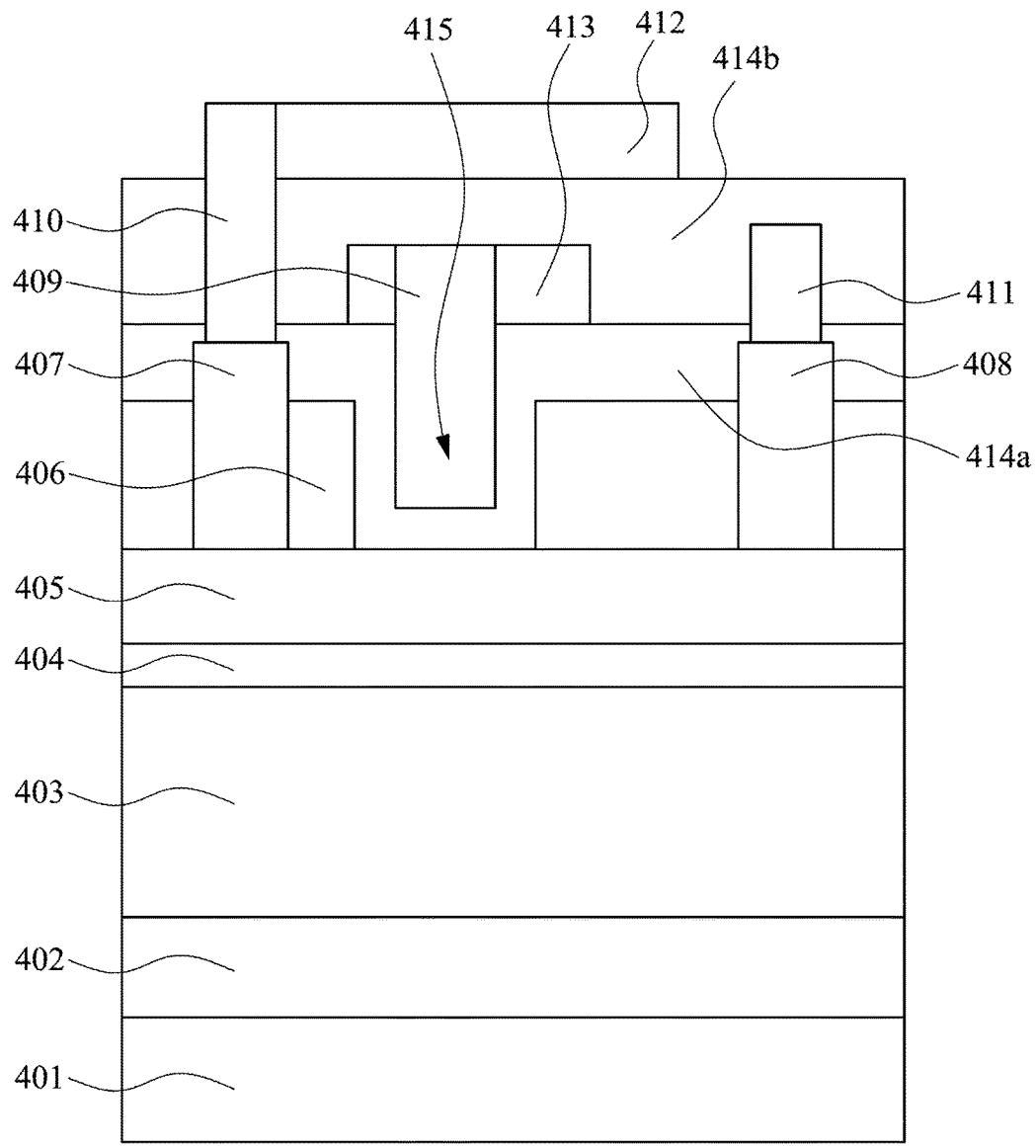

In an embodiment of the present disclosure, FIG. 4 shows a semiconductor device 400. The difference between the semiconductor device 400 and the semiconductor device 300 is that semiconductor device 400 further includes a recess 415 in the reverse polarization layer 406, in which the gate 409 inserts and a portion of the insulating layer 414a fills in a sidewall and a bottom of the recess 415. The semiconductor device 400 includes a substrate 401 that can be made of a variety of materials such as Ge, SiGe, SiC, Si, sapphire, or a combination thereof. A buffer layer 402 disposed on the substrate. In some embodiments, the buffer layer 402 can be made of GaN, AlN, AlGaN, or a combination thereof. A channel layer 403 disposed on the buffer layer 402. The channel layer 403 can be made of GaN, InGaN, AlInGaN, AlGaN, or a combination thereof. In some embodiments, a spacer layer 404 of AlN is optionally disposed on the channel layer 403. The spacer layer 404 can reduce alloy scattering effect and increase 2DEG. In some embodiments, the thickness of spacer layer 404 is in the range from about 0.5 nm to 2.5 nm. An $Al_xIn_{1-x}N$ layer 405, where 0<x<1, is disposed on the spacer layer 404. A reverse polarization layer 406 is disposed on the $Al_xIn_{1-x}N$ layer 405. In some embodiments, the reverse polarization layer 406 can be made of GaN, InGaN, $Al_yIn_{1-y}N$, AlInGaN or a combination thereof, and x>y. In other words, when the reverse polarization layer 406 is made of $Al_yIn_{1-y}N$, the Al composition in the reverse polarization layer 406 is lower than the Al composition in the $Al_xIn_{1-x}N$ layer 405. The polarization field of the reverse polarization layer 406 is smaller than that of the $Al_xIn_{1-x}N$ layer 405, and a thickness ratio of the reverse polarization layer 406 and the $Al_xIn_{1-x}N$ layer 405 is between 0.5 and 3. In some embodiments, the thickness ratio of the reverse polarization layer 406 and the $Al_xIn_{1-x}N$ layer 405 is between 1 and 2. In some embodiments, the thickness ratio of the reverse polarization layer 406 and the $Al_xIn_{1-x}N$ layer 405 is between 1.1 and 1.5.

The semiconductor device 400 further includes a source 407, a drain 408, a gate 409, a source contact 410, a drain contact 411, a source field plate 412, a gate field plate 413 and an insulating layer 414. The insulating layer 414 includes an insulating layer 414a and an insulating layer 414b. The reverse polarization layer 406 includes a recess 415, in which the gate 409 inserts and a portion of the insulating layer 414a fills in a sidewall and a bottom of the recess 415. The gate field plate 413 is formed and connected to a sidewall of the gate 409. The insulating layer 414b is further covering on the gate 409 and the gate field plate 413. The source 407 and the drain 408 are formed at opposite sides of the gate 409 and on the $Al_xIn_{1-x}N$ layer 405. A source contact 410 is formed on the source 407, and a drain contact 411 is formed on the drain 408. Besides, a source field plate 412 is formed on the gate and physically connected to the source contact 410. In some embodiments, the source 407 and the drain 408 can be formed by doping N-type impurities or P-type impurities in a semiconductor layer, such as Si, Ge or SiGe. In some embodiments, the gate 409, the source contact 410, and the drain contact 411 can be made of Ni, Al, Ti, Au, W, TiN, or a combination thereof. The insulating layer 414 can be independently made of $SiO_2$, SiNx, $Al_2O_3$, $HfO_2$, $TiO_2$, or a combination thereof.

In one specific embodiment, the result is measured from the semiconductor device 100 in which it includes a substrate 101; a buffer layer 102 made of AlN/AlGaN composite having a thickness of about 1.25 μm; a channel layer 103 made of GaN having a thickness of about 2.5 μm; a spacer layer 104 made of AlN having a thickness of about 1 nm; an $Al_xIn_{1-x}N$ layer 105 made of $Al_{0.89}In_{0.11}N$ having a thickness of about 10 nm and a reverse polarization layer 106 made of GaN having a thickness of 0, 5, 13, 26 nm. Note that the thickness of reverse polarization layer 106 in this work is much larger than the typical ones, i.e. 2-3 nm, in AlInN-based HEMTs.

By increasing the thickness of the reverse polarization layer 106, the semiconductor devices reduce surface electric field, raise the conduction band of the layer and effectively prevent electrons from being trapped in the $Al_xIn_{1-x}N$ layer 105. These characteristics not only increase electron mobility and breakdown voltage but also decrease leakage current and dynamic $R_{on}$ ratio of the semiconductor device.

The semiconductor device without reverse polarization layer 106 shows the maximum band energy of the $Al_xIn_{1-x}N$ layer of 2 eV, while the band energy increases by the increase of the thickness of the reverse polarization layer 106. The maximum band energy of the $Al_xIn_{1-x}N$ layer 105 with 5, 13, 26 nm thickness of reverse polarization 106 is raised to above 4 eV.

Transport properties of the semiconductor devices were accessed by van der Pauw Hall measurements. Due to the reverse polarization field of reverse polarization layer 106 on $Al_xIn_{1-x}N$ layer 105, the increase in the thickness of reverse polarization layer 106 raises the conduction band and decreases the 2DEG concentration (Table 1). The 2DEG concentration of the semiconductor devices with 0, 5, 13, 26 nm thickness of reverse polarization layer 106 are $2.76 \times 10^{13}$, $2.32 \times 10^{13}$, $1.74 \times 10^{13}$, and $1.59 \times 10^{13}$ $cm^{-2}$, respectively. The electron mobility of the semiconductor devices with 0, 5, 13, 26 nm thickness of reverse polarization layer 106 at room temperature are 780, 974, 1330, and 1320 $cm^2/Vs$, respectively, which increases with increasing reverse polarization layer 106 thickness and saturates as the thickness reaches 13 nm (Table 1). The sheet resistances ($R_{sh}$) of the semiconductor devices with 0, 5, 13, 26 nm thickness of reverse polarization layer 106 are 290, 276, 271, and 299 Ω/sq, respectively, which are consistently lower than that of its AlGaN counterparts (Table 1).

TABLE 1

| | Reverse polarization layer thickness (nm) | | | |
|---|---|---|---|---|
| | 0 | 5 | 13 | 26 |
| 2DEG concentration ($cm^{-2}$) | $2.76 \times 10^{13}$ | $2.32 \times 10^{13}$ | $1.74 \times 10^{13}$ | $1.59 \times 10^{13}$ |
| Electron mobility ($cm^2/Vs$) | 780 | 974 | 1330 | 1320 |
| $R_{sh}$ (Ω/sq) | 290 | 276 | 271 | 299 |
| Breakdown voltage (V) | 72 | 89 | 116 | 172 |
| Dynamic $R_{on}$ ratio | 20 | 2.3 | 2.1 | 1.7 |

The breakdown voltage of the semiconductor devices with 0, 5, 13, 26 thickness of reverse polarization are 72, 89, 116 and 172 V, respectively (Table 1). The off-state leakage current, which is dominated by the gate leakage current, also consistently decreases with increasing thickness of the reverse polarization layer 106.

The dynamic on-state resistance ($R_{on}$) ratio of the HEMT devices reduces with the increasing of the reverse polarization thickness. The devices were stressed under the off-state condition with a constant $V_d$ for 10 ms, before being the biased to the on-state linear region for 4 ms to observe the variation in $R_{on}$. Dynamic $R_{on}$ ratio defined as the ratio of $R_{on}$ at 100 μs after the stress to the static $R_{on}$. As an important performance index for switching, dynamic $R_{on}$ reflects the charge trapping behaviors in the material and has been attributed to the trap states at the surface, $Al_xIn_{1-x}N$ layer, reverse polarization layer, interface and the buffer layer. Higher stress voltage leads to larger dynamic $R_{on}$ ratio and thicker reverse polarization layer causes lower electric field near the gate and smaller dynamic $R_{on}$ ratio. The dynamic $R_{on}$ ratio of the semiconductor device without reverse polarization layer 106 is 20 after a 40V stress, while the semiconductor devices with 5, 13, 26 nm thickness of reverse polarization layer 106 are significantly reduced to 2.3, 2.1 and 1.7, respectively (Table 1).

Figure 5:
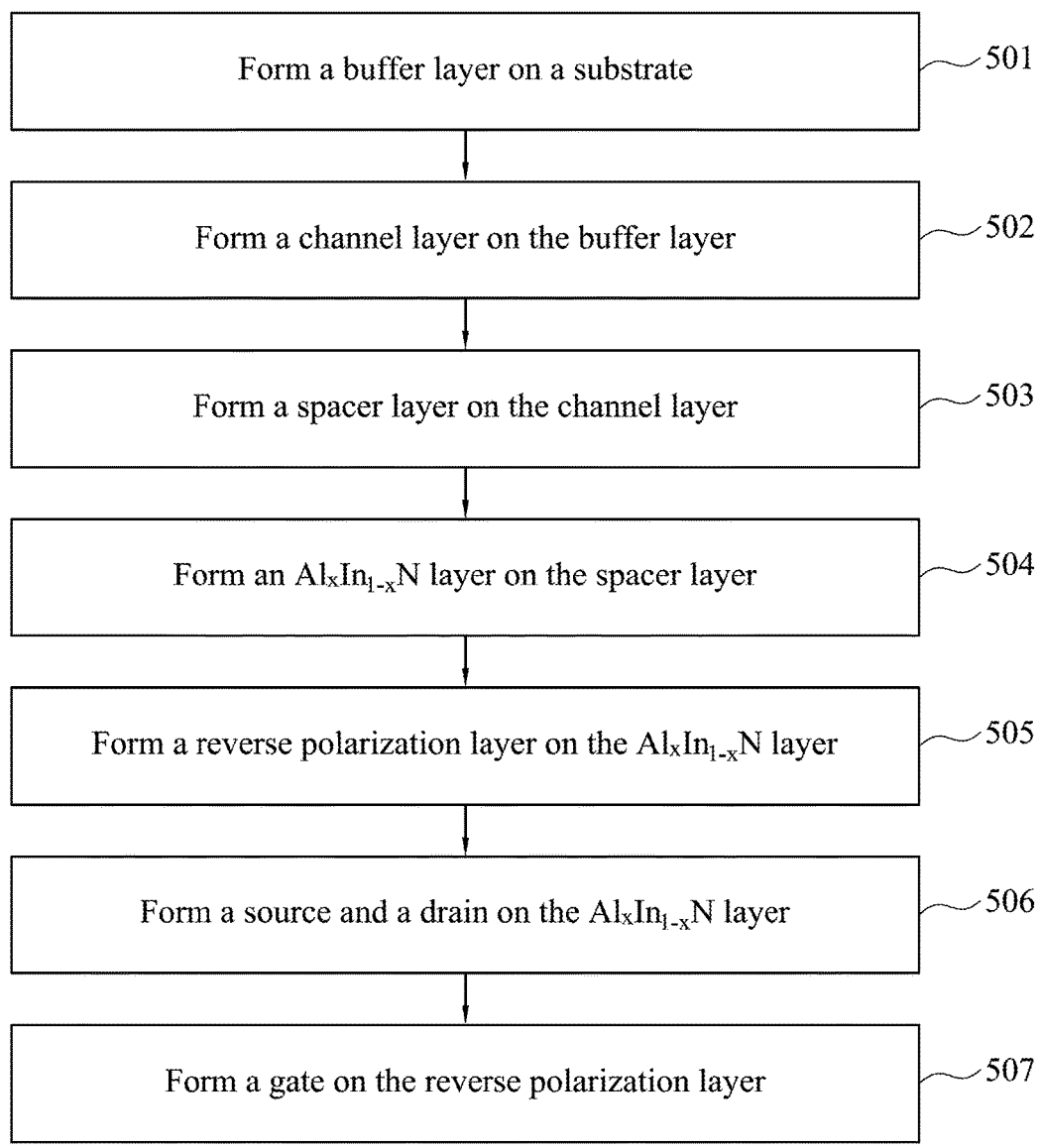
FIG. 5 illustrates a flowchart of the method of fabricating a semiconductor device in accordance with some embodiments.

FIG. 5 shows a flowchart illustrating a method for manufacturing the semiconductor device 100. For manufacturing the semiconductor device 100, the method begins at step 501 and ends at step 507. In step 501, a buffer layer 102 is formed on a substrate 101. In step 502, a channel layer 103 is formed on the buffer layer 102. In step 503, a spacer layer 104 is optionally formed on the channel layer 103. In step 504, an $Al_xIn_{1-x}N$ layer 105 is formed on the optional spacer layer 104. In step 505, a reverse polarization layer 106 is formed on the $Al_xIn_{1-x}N$ layer 105. The growth of the aforementioned semiconductor layer (i.e. the buffer layer 102, the channel layer 103, the spacer layer 104, the $Al_xIn_{1-x}N$ layer 105 and the reverse polarization layer 106) is carried out by the well-know technique of the metal-organized-chemical-vapor-deposition (MOCVD). In step 506, form a source 107 and a drain 108 on the $Al_xIn_{1-x}N$ layer 105 and then form a source contact 110 and a drain contact 111 on the source 107 and the drain 108, respectively. The source 107 and the drain 108 can be formed by epitaxy and ion implantation. Finally, in step 507, a gate 109 is formed on the reverse polarization layer 106 and let the source 107 and the drain 108 at opposite sides of the gate 109. The gate 109 can be formed by any deposition process.

The materials of these features or structures are mentioned above, which is not described again for simplicity.

The manufacturing of the semiconductor device 200 is similar with the manufacturing of the semiconductor device 100 with a difference after step 506. After step 506, a recess 213 is formed in the reverse polarization layer 206 and let the source 207 and the drain 208 at opposite sides of the recess 213. Then, a gate 209 is formed in the recess 213 and a gate field plate 212 is formed and connected to a sidewall of the gate 209. The recess can be formed by photolithography.

The manufacturing of the semiconductor device 300 is similar with semiconductor device 100 with a difference after step 506. After step 506, an insulating layer 314a is deposited on the reverse polarization layer 306 and includes a recess 315. Let the source 307 and the drain 308 at opposite sides of the recess 315, in which a gate 309 inserts. A gate field plate 313 is formed on the reverse polarization layer 306 and connected to a sidewall of the gate 309. The insulating layer 314b is further encompassing on the gate 309 and the gate field plate 313. Finally, a source field plate 312 is formed on the gate 309 and physically connected to the source contact 310.

The manufacturing of the semiconductor device 400 is similar with semiconductor device 300 with a difference after step 506. After step 506, the reverse polarization layer 406 includes a recess 415, in which the gate 409 inserts and a portion of the insulating layer 414a fills in a sidewall and a bottom of the recess 415. The recess 415 can be formed by photolithography. A gate field plate 413 is formed on the reverse polarization layer 406 and connected to a sidewall of the gate 409. An insulating layer 414b is further encompassing on the gate 409 and the gate field plate 413. Finally, a source field plate 412 is formed on the gate and physically connected to the source contact 410.

The present disclosure has advantages over the existed semiconductor devices. By having this thickness ratio of the reverse polarization layer and the $Al_xIn_{1-x}N$ layer, the semiconductor devices reduce surface electric field, raise the conduction band of the $Al_xIn_{1-x}N$ layer and effectively prevent electrons from being trapped in the $Al_xIn_{1-x}N$ layer. These characteristics not only increase electron mobility and breakdown voltage but also decrease leakage current and dynamic $R_{on}$ ratio of the semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device comprising:
   a channel layer;
   a spacer layer on the channel layer;
   an $Al_xIn_{1-x}N$ layer on the spacer layer with a thickness of t1;
   a reverse polarization layer on and in direct contact with the $Al_xIn_{1-x}N$ layer with a thickness of t2, wherein $0.5 \times t1 \leq t2 \leq 3 \times t1$ and $0<x<1$, wherein the reverse polarization layer comprises GaN, InGaN, $Al_yIn_{1-y}N$, AlInGaN or a combination thereof, and x>y; and
   a source and a drain both directly contacting the $Al_xIn_{1-x}N$ layer and the reverse polarization layer, wherein each of a bottom surface of the source and a bottom surface of the drain directly contacts a top surface of the $Al_xIn_{1-x}N$ layer.

2. The semiconductor device of claim 1, wherein the channel layer comprises GaN, InGaN, AlInGaN, AlGaN or a combination thereof.

3. The semiconductor device of claim 1, wherein a polarization field of the reverse polarization layer is smaller than that of the $Al_xIn_{1-x}N$ layer.

4. The semiconductor device of claim 1, wherein
   a buffer layer comprises an AlN/AlGaN composite layer having a thickness of about 1.25 μm;
   the channel layer comprises a GaN layer having a thickness of about 2.5 μm;
   the spacer layer comprises an AlN layer having a thickness of about 1 nm;
   the $Al_xIn_{1-x}N$ layer comprises an $Al_{0.89}In_{0.11}N$ layer having a thickness of about 10 nm; and
   the reverse polarization layer comprises a GaN layer having a thickness ranged from about 5 to about 26 nm.

5. The semiconductor device of claim 1, wherein the spacer layer is interposed between the channel layer and the $Al_xIn_{1-x}N$ layer, and directly contacts each of the channel layer and the $Al_xIn_{1-x}N$ layer.

6. The semiconductor device of claim 1, wherein each of the source and the drain extends through the reverse polarization layer, and when viewed in cross section, a section of the reverse polarization layer is on one side of the source, another section of the reverse polarization layer is on another side of the source, a section of the reverse polarization layer is on one side of the drain, and another section of the reverse polarization layer is on another side of the drain.

7. The semiconductor device of claim 5, wherein the spacer layer is formed from AlN with a thickness of t3, and t3 is between 0.5 nm and 2.5 nm.

8. The semiconductor device of claim 6, wherein each of a portion of the source and a portion of the drain extends above the reverse polarization layer.

9. The semiconductor device of claim 8, further comprising:
a gate on the reverse polarization layer, wherein the source and the drain are at opposite sides of the gate;
a source contact on the source; and
a drain contact on the drain;
wherein the source contact is disposed on the portion of the source that extends above the reverse polarization layer, and the drain contact is disposed on the portion of the drain that extends above the reverse polarization layer.

10. The semiconductor device of claim 9, wherein the gate is made of Ni, Al, Ti, Au, W, TiN, or a combination thereof.

11. The semiconductor device of claim 9, wherein the source contact and the drain contact are made of a material independently selected from a group consisting of Ni, Al, Ti, Au, W, TiN and a combination thereof.

12. The semiconductor device of claim 9, further comprising a recess in the reverse polarization layer, in which the gate inserts.

13. The semiconductor device of claim 9, further comprising a gate field plate on the reverse polarization layer and connected to a sidewall of the gate.

14. The semiconductor device of claim 9, further comprising a source field plate on the gate and physically connected to the source contact.

15. The semiconductor device of claim 13, further comprising an insulating layer encompassing the gate and the gate field plate, wherein the insulating layer comprises $SiO_2$, SiNx, $Al_2O_3$, $HfO_2$, $TiO_2$, or a combination thereof.

16. The semiconductor device of claim 15, further comprising a recess in the reverse polarization layer, in which the gate inserts and a portion of the insulating layer fills in.

17. A method of manufacturing a semiconductor device, the method comprising:
forming a channel layer on a substrate;
forming a spacer layer on the channel layer;
forming an $Al_xIn_{1-x}N$ layer on the spacer layer with a thickness of t1;
forming a reverse polarization layer on and in direct contact with the $Al_xIn_{1-x}N$ layer with a thickness of t2, wherein $0.5 \times t1 \leq t2 \leq 3 \times t1$ and $0<x<1$, wherein the reverse polarization layer comprises GaN, InGaN, $Al_yIn_{1-y}N$, AlInGaN or a combination thereof, and $x>y$; and
forming a source and a drain both directly contacting the $Al_xIn_{1-x}N$ layer and the reverse polarization layer, wherein each of a bottom surface of the source and a bottom surface of the drain directly contacts a top surface of the $Al_xIn_{1-x}N$ layer.

18. The method of claim 17, further comprising:
forming a gate on the reverse polarization layer, wherein the source and the drain are at opposite sides of the gate and on the $Al_xIn_{1-x}N$ layer;
forming a source contact on the source; and
forming a drain contact on the drain.

19. The method of claim 18, further comprise forming a recess in the reverse polarization layer, in which the gate inserts.

20. The method of claim 18, further comprise forming a source field plate on the gate and physically connected to the source contact.

21. The method of claim 18, further comprise forming a gate field plate on the reverse polarization layer and connected to a sidewall of the gate.

* * * * *